(12) United States Patent
Kopko et al.

(10) Patent No.: US 9,754,574 B2
(45) Date of Patent: Sep. 5, 2017

(54) SYSTEM AND METHOD FOR REDUCING NOISE WITHIN A REFRIGERATION SYSTEM

(71) Applicant: Johnson Controls Technology Company, Holland, MI (US)

(72) Inventors: William L. Kopko, Jacobus, PA (US); Atul Singh, York, PA (US); Satheesh Kulankara, York, PA (US); Andrew J. Graybill, Etters, PA (US); Lewis M. Bass, Lancaster, PA (US)

(73) Assignee: JOHNSON CONTROLS TECHNOLOGY COMPANY, Holland, MI (US)

( * ) Notice: Subject to any disclaimer, the term of this patent is extended or adjusted under 35 U.S.C. 154(b) by 476 days.

(21) Appl. No.: 14/357,534

(22) PCT Filed: Nov. 29, 2012

(86) PCT No.: PCT/US2012/067105
§ 371 (c)(1),
(2) Date: May 9, 2014

(87) PCT Pub. No.: WO2013/082306
PCT Pub. Date: Jun. 6, 2013

(65) Prior Publication Data
US 2014/0318162 A1     Oct. 30, 2014

Related U.S. Application Data

(60) Provisional application No. 61/565,347, filed on Nov. 30, 2011.

(51) Int. Cl.
*G10K 11/16*     (2006.01)
*G06F 17/50*     (2006.01)
(Continued)

(52) U.S. Cl.
CPC .......... *G10K 11/161* (2013.01); *F25B 49/025* (2013.01); *G06F 17/5009* (2013.01);
(Continued)

(58) Field of Classification Search
CPC ....... G10K 11/161; F24F 1/12; Y02B 30/743; F25B 2500/12; F25B 2600/02; F25B 2600/111
See application file for complete search history.

(56) References Cited

U.S. PATENT DOCUMENTS

| 6,775,995 | B1 * | 8/2004 | Bahel ................. G06F 17/5009 62/127 |
|---|---|---|---|
| 7,690,211 | B2 | 4/2010 | Sakurai et al. |
| 2004/0199371 | A1 | 10/2004 | Sasano et al. |

FOREIGN PATENT DOCUMENTS

| CN | 1588379 | 3/2005 |
|---|---|---|
| JP | H09257319 | 10/1997 |

(Continued)

OTHER PUBLICATIONS

Bo Sangfors, Modeling, Measurements and Analysis of Gas-Flow Generated Noise From Twin-Scew Compressors,; 2000, Purdu University; e-Pubs. Paper 1487; http://docs.lib.purdue.edu/icec/1487.*

(Continued)

*Primary Examiner* — Emmanuel Duke
(74) *Attorney, Agent, or Firm* — Fletcher Yoder, P.C.

(57) ABSTRACT

A method is provided including receiving a first input indicative of a desired design capacity of a refrigeration system, and receiving a second input indicative of a desired maximum acoustical noise of the refrigeration system. The method also includes iteratively selecting a candidate compressor system from a set of compressor systems, and iteratively selecting a candidate condenser system from a set of condenser systems. In addition, the method includes (Continued)

simulating operation of the refrigeration system based on the candidate compressor system and the candidate condenser system until a suitable refrigeration system is established having a computed design capacity greater than or equal to the desired design capacity, and a computed maximum acoustical noise less than or equal to the desired maximum acoustical noise. The method further includes providing an output indicative of the candidate compressor system and the candidate condenser system of the suitable refrigeration system.

19 Claims, 7 Drawing Sheets (51) Int. Cl.
F25B 49/02 (2006.01)
F24F 1/12 (2011.01)

(52) U.S. Cl.
CPC .............. F24F 1/12 (2013.01); F25B 2500/12 (2013.01); F25B 2600/02 (2013.01); F25B 2600/111 (2013.01); Y02B 30/743 (2013.01)

(56) References Cited

FOREIGN PATENT DOCUMENTS

| JP | 20020267287 | 9/2002 |
| JP | 20060242429 | 9/2006 |

OTHER PUBLICATIONS

Bo Sangfors, Modeling, Measurements and Analysis of Gas-Flow Generated Noise From Twin-Srew Compressor; 2000, Purdue University; e-Pubs. Paper 1487; http://docs.lib.purdue.edu/icec/1487.*
CN 201280059209.4 Office Action dated Apr. 18, 2016.
Office Action for Japanese Application No. 2014-544888 mailed Feb. 10, 2015.
Ding et al., "Recent developments in simulation techniques for vapour-compression for refrigeration systems," International Journal of Refrigeration, Rlsevier, Paris, France, vol. 30, No. 7, Nov. 1, 2007, pp. 1119-1133.
Gholap et al., "Design and multi-objective optimization of heat exchangers for refrigerators," Applied Energy, Elsevier Science Publishers, GB, vol. 94, No. 12, Sep. 4, 2007, pp. 1226-1239.
PCT International Search Report and Written Opinion for International Application No. PCT/US2012/067105 mailed Jun. 5, 2013.

* cited by examiner

SYSTEM AND METHOD FOR REDUCING NOISE WITHIN A REFRIGERATION SYSTEM

CROSS REFERENCE TO RELATED APPLICATIONS

This application claims the benefit of International Application No. PCT/US12/67105, entitled "SYSTEM AND METHOD FOR REDUCING NOISE WITHIN A REFRIGERATION SYSTEM," filed Nov. 29, 2012, which claims the benefit of U.S. Provisional Application No. 61/565,347, entitled "SYSTEM AND METHOD FOR REDUCING NOISE WITHIN A REFRIGERATION SYSTEM," filed Nov. 30, 2011, which are each hereby incorporated by reference in their entirety.

BACKGROUND

The invention relates generally to a system and method for reducing noise within a refrigeration system.

Certain refrigeration and air conditioning systems generally rely on a chiller to reduce the temperature of a process fluid, such as water, to produce chilled process fluid. Air may pass over the chilled process fluid in an air handler and circulate throughout a building or other application to be cooled. In typical chillers, the process fluid is cooled by an evaporator that absorbs heat from the process fluid by evaporating refrigerant within the evaporator. The refrigerant may then be compressed in a compressor and transferred to a condenser, such as an air cooled condenser. In an air cooled condenser, the refrigerant is cooled by air and condensed into a liquid. Air cooled condensers typically include a condenser coil and a fan that induces airflow over the coil. The amount of airflow over the coil may be varied by either adjusting the speed of the fan, or in multiple fan configurations, by staging the fans. Staging involves selectively operating fans associated with certain condenser coils. A combination of staging and varying fan speed may also be employed.

Operation of the condenser fans and the compressor induces the refrigeration system to emit acoustical noise. Certain local ordinances may prescribe maximum acoustical noise limits for equipment located on land within a particular commercial or residential zone. Unfortunately, the process of selecting a refrigeration system that conforms to desired operational parameters, such as efficiency, capacity and acquisition cost, may result in a refrigeration system that exceeds the prescribed maximum acoustical noise limits when operated efficiently. Consequently, the refrigeration system may be operated within an inefficient regime to conform to the noise limits, thereby increasing costs associated with operation of the refrigeration system.

SUMMARY

The present disclosure relates to a computer-implemented method including using a processor of a data processing system to perform the steps of receiving a first input indicative of a desired design capacity of a refrigeration system, and receiving a second input indicative of a desired maximum acoustical noise of the refrigeration system. The method also includes iteratively selecting a candidate compressor system from a set of compressor systems, and iteratively selecting a candidate condenser system from a set of condenser systems. In addition, the method includes simulating operation of the refrigeration system based on the candidate compressor system and the candidate condenser system until a suitable refrigeration system is established having a computed design capacity greater than or equal to the desired design capacity, and a computed maximum acoustical noise less than or equal to the desired maximum acoustical noise. The method further includes providing an output indicative of the candidate compressor system and the candidate condenser system of the suitable refrigeration system.

The present disclosure also relates to a refrigeration system including a compressor system configured to compress refrigerant, and a condenser system configured to receive and to condense the compressed refrigerant. The refrigeration system also includes an expansion device configured to expand the condensed refrigerant, and an evaporator system configured to evaporate the expanded refrigerant prior to returning the refrigerant to the compressor system. The compressor system and the condenser system are selected based on a desired design capacity of the refrigeration system, and a desired maximum acoustical noise of the refrigeration system.

The present invention further relates to a system including a data processing system configured to perform the steps of receiving a first input indicative of a desired design capacity of a refrigeration system, and receiving a second input indicative of a desired maximum acoustical noise of the refrigeration system. The steps also include iteratively selecting a candidate compressor system from a set of compressor systems, and iteratively selecting a candidate condenser system from a set of condenser systems. In addition, the steps include simulating operation of the refrigeration system based on the candidate compressor system and the candidate condenser system until a suitable refrigeration system is established having a computed design capacity greater than or equal to the desired design capacity, and a computed maximum acoustical noise less than or equal to the desired maximum acoustical noise. The steps further include providing an output indicative of the candidate compressor system and the candidate condenser system of the suitable refrigeration system.

DETAILED DESCRIPTION

The present disclosure is directed to techniques for selecting components of a refrigeration system based on a desired maximum acoustical noise level. In certain embodiments, a method for configuring a refrigeration system includes receiving a first input indicative of a desired design capacity of the refrigeration system, and receiving a second input indicative of a desired maximum acoustical noise of the refrigeration system. The method also includes iteratively selecting a candidate compressor system from a set of compressor systems, and iteratively selecting a candidate condenser system from a set of condenser systems. In addition, the method includes simulating operation of the refrigeration system based on the candidate compressor system and the candidate condenser system until a suitable refrigeration system is established having a computed design capacity greater than or equal to the desired design capacity, and a computed maximum acoustical noise less than or equal to the desired maximum acoustical noise. The method further includes providing an output indicative of the candidate compressor system and the candidate condenser system of the suitable refrigeration system. In this manner, a refrigeration system may be configured that operates within an efficient regime, while limiting acoustical noise to desired levels.

Figure 1:
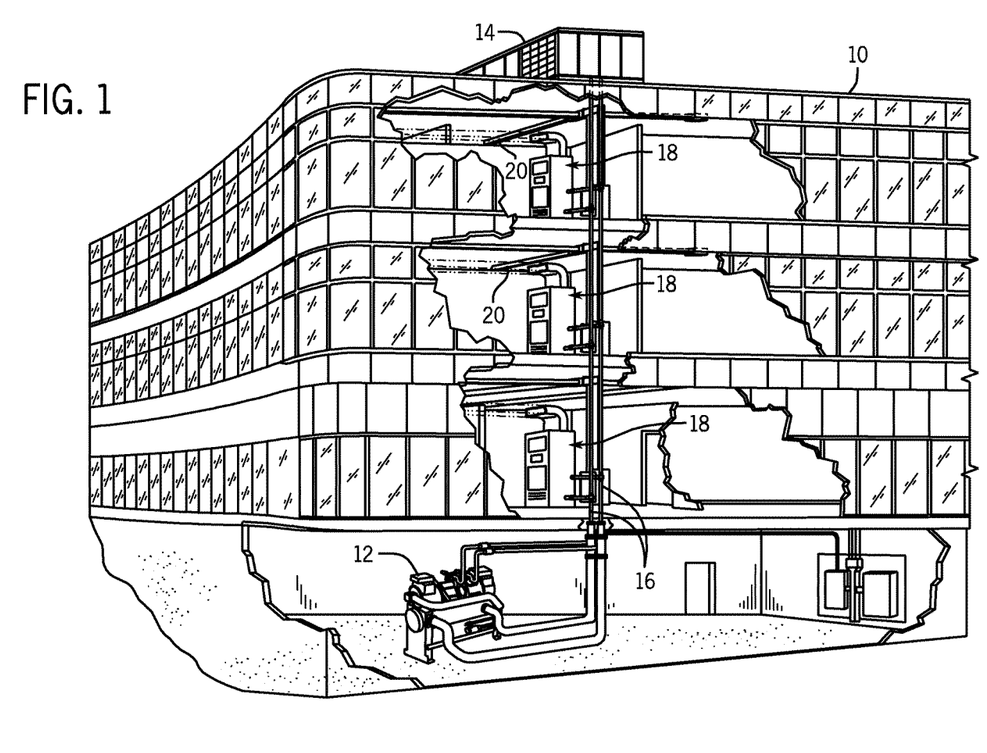
FIG. 1 is a perspective view of an embodiment of a commercial HVAC system that employs an air cooled refrigeration system.

FIG. 1 shows an application of a heating, ventilation, and air conditioning (HVAC) system for building environmental management. In this embodiment, a building 10 is cooled by a refrigeration system. The refrigeration system may include a chiller 12 and a condenser 14. As shown, the chiller 12 is located in the basement, and the condenser 14 is positioned on the roof. However, the chiller 12 and the condenser 14 may be located in other areas, such as other equipment rooms or areas next to the building 10. The condenser 14 depicted in FIG. 1 is air cooled, i.e., uses outside air to cool refrigerant such that it condenses into a liquid. The chiller 12 may be a stand-alone unit or may be part of a single package unit containing other equipment, such as a blower and/or an integrated air handler. Cold process fluid from the chiller 12 may be circulated through the building 10 by conduits 16. The conduits 16 are routed to air handlers 18, located on individual floors and within sections of the building 10.

The air handlers 18 are coupled to ductwork 20 that is adapted to distribute air between the air handlers. Further, the ductwork 20 may receive air from an outside intake (not shown). The air handlers 18 include heat exchangers that circulate cold process fluid from the chiller 12 to provide cooled air. Fans, included within the air handlers 18, draw air through the heat exchangers and direct the conditioned air to environments within the building 10, such as rooms, apartments, or offices, to maintain the environments at a designated temperature. Other devices maybe included in the system, such as control valves that regulate the flow and pressures of the process fluid and/or temperature transducers or switches that sense the temperatures and pressures of the process fluid, the air, and so forth.

Figure 2:
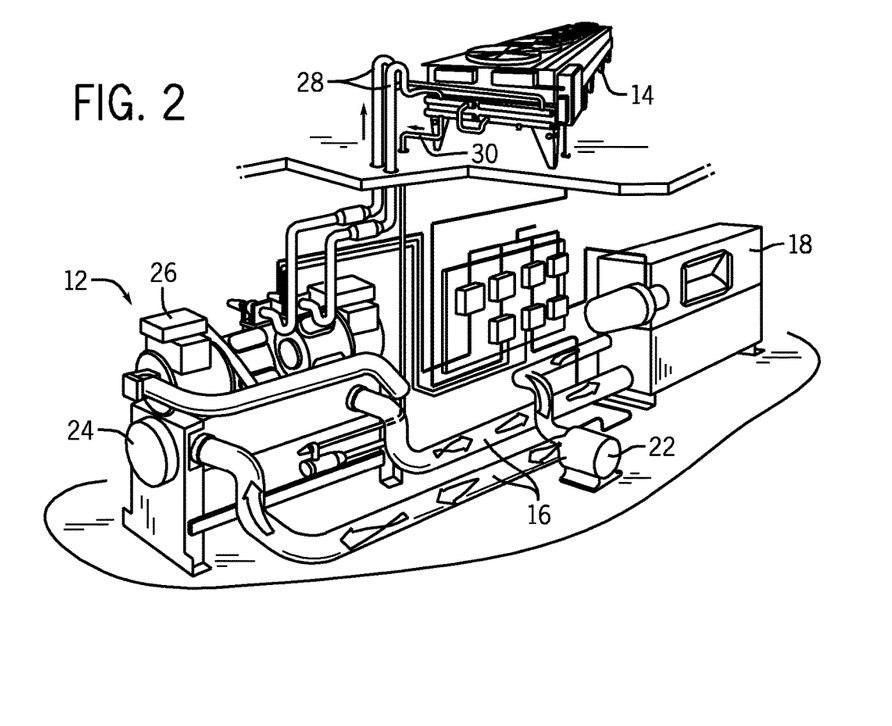
FIG. 2 is a perspective view of the air cooled refrigeration system shown in FIG. 1.

FIG. 2 is a perspective view of an embodiment of a refrigeration system. As described above with respect to FIG. 1, air is cooled in the air handlers 18 that circulate air over cold process fluid to reduce the building temperature. The cold process fluid is pumped to the air handlers 18 from the chiller 12 by a fluid pump 22. In the chiller 12, the process fluid is cooled in an evaporator 24 that reduces the process fluid temperature by transferring heat to evaporating refrigerant. The refrigerant is then compressed by a compressor system 26 and transferred to the condenser 14 through compressor discharge lines 28. The condenser 14 condenses the refrigerant vapor into a liquid, which then flows through the liquid lines 30 back into the evaporator 24, where the process begins again.

Figure 3:
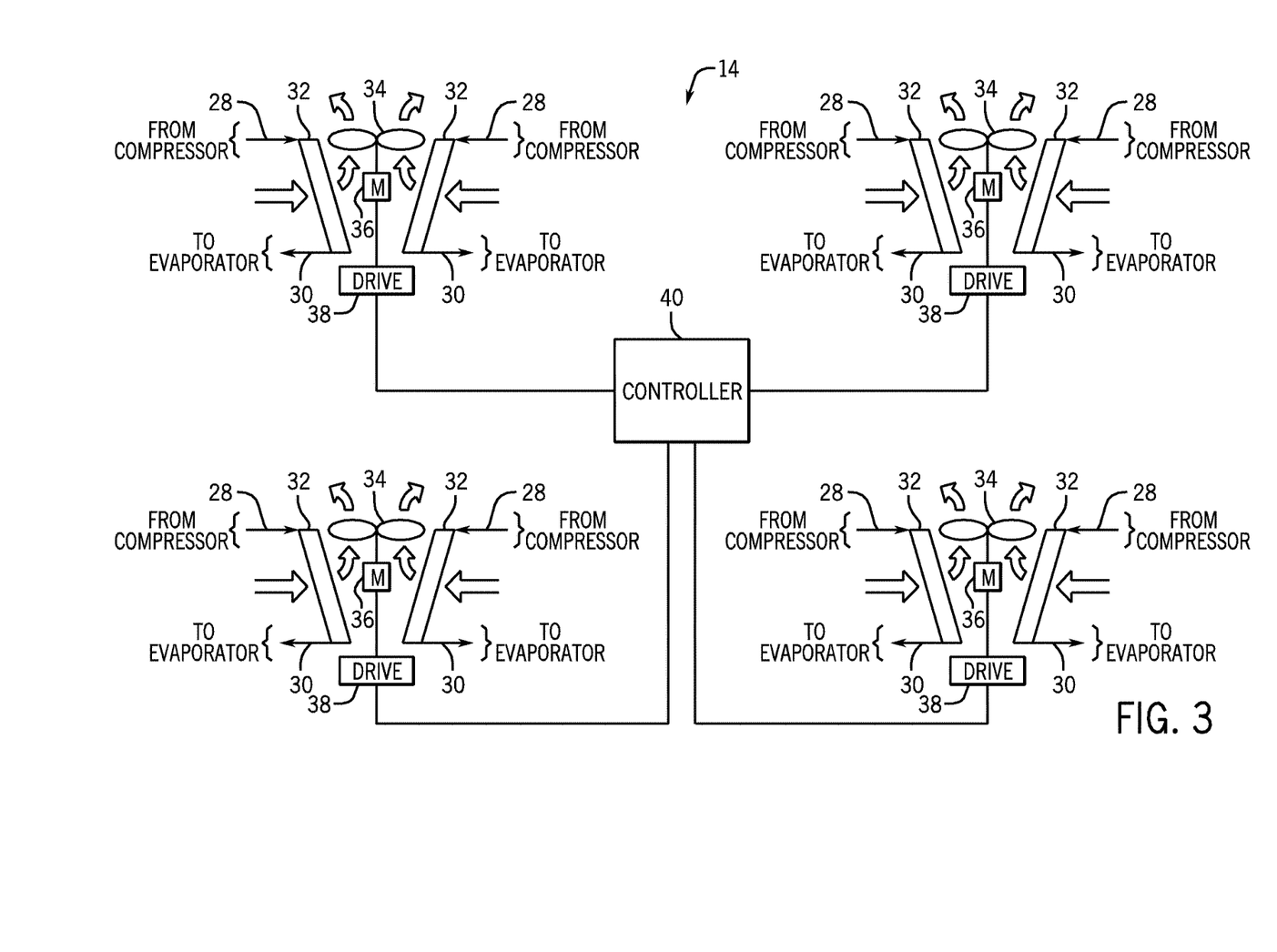
FIG. 3 is a block diagram of a condenser that may be used in the refrigeration system shown in FIGS. 1 and 2.

FIG. 3 is a diagrammatical view of the condenser 14 of the refrigeration system shown in FIG. 2. The condenser 14 presented in this embodiment is air cooled and includes eight condenser coils 32. The number of condenser coils may vary based on the size of the condenser coils 32 and the capacity of the refrigeration system. Higher capacity systems may employ a greater number of larger condenser coils 32, while low capacity systems may use one small coil 32. The condenser coils 32 are typically configured to facilitate heat transfer from refrigerant within the condenser coils 32 to the outside air. The transfer of heat from the refrigerant to the outside air reduces the refrigerant temperature, which generally causes the refrigerant to condense from a vapor into a liquid. The refrigerant typically enters the top of each condenser coil 32 through a compressor discharge line 28 and exits at the bottom of each condenser coil 32 through a liquid line 30.

To further facilitate heat transfer, fans 34 may circulate air through the condenser coils 32. In the present embodiment, each fan 34 includes fan blades and a drive unit (e.g., motor) 36. The fan blades are generally designed to provide sufficient airflow through the condenser coils 32 while minimizing the power used to drive the fan blades. The fan blade design generally depends on the application, but may include varying the number of blades and the pitch of each blade. The fan motor 36 may be electrically or mechanically driven. However, typical commercial condensers may employ three-phase alternating current (A/C) electric motors. The performance of the fan motors may be dependent on the number of electromagnetic windings, known as poles. A six or eight pole motor, for example, may provide the most efficient airflow for certain condenser configurations.

In the configuration shown in FIG. 3, each fan 34 circulates air through two condenser coils 32. According to certain embodiments, the condenser coils 32 associated with each fan 34 are angled such that the coils are closer together at the bottom and farther apart at the top near the fan 34. As shown, the angled configuration induces airflow through the side of each condenser coil 32. The air then moves upward through the fan blades and exits the condenser 14, as generally indicated by the arrows. In other embodiments, the configuration of the condenser coils 32 may vary based on the refrigeration system application. For example, other condenser designs may provide one fan 34 for each condenser coil 32 or multiple fans 34 for each condenser coil 32.

In the embodiment depicted in FIG. 3, each fan motor 36 is controlled by a motor drive 38. According to certain embodiments, the motor drives 38 may include motor starters and variable speed drives (VSD). A VSD allows the speed of the fan motor 36 to be continuously varied. For example, if the fan motor 36 is an 8-pole, three-phase, A/C electric motor and the frequency of the supplied electricity is 60 Hz, the fan motor 36 may rotate at 900 revolutions per minute (RPM.) A VSD may vary the frequency of the electricity supplied to the fan motor 36 such that the fan motor 36 may be operated at different speeds. Varying the speed of the fan motor 36 changes the amount of air that flows through the condenser coils 32. Although FIG. 3 shows individual motor drives 38 electrically coupled to each fan motor 36, in other embodiments, where desired, a single drive 38 may be employed and shared between the fan motors. Employing a single motor drive 38 to control each fan motor 36 may reduce construction costs and increase the reliability of the condenser 14. Further, in other embodiments, rather than employing VSDs, motor drives 38 may be employed that operate the fans at a constant speed in a staged configuration. In these embodiments, the amount of airflow through the condenser coils 32 may be varied by adjusting the number of fans that are operational. For example, more fans may be enabled to increase the airflow through the condenser coils 32, while fewer fans may be enabled to decrease the airflow through the condenser coils 32.

The motor drives 38 may use an input signal to engage the fan motors 36 and, in the case of VSDs, specify an operational speed for the fan motors 36. The motor drives 38 may receive the input signals from a controller 40 that is electrically coupled to each motor drive 38. The controller 40 may determine the proper fan operation based on the desired or actual compressor system capacity. For example, based on the desired or actual compressor system capacity, the controller 40 may determine the number of fans to operate and/or the operational speed for each fan. The controller 40 may then provide input signals to the motor drives 38 to engage the appropriate fans 34 and/or to operate the fans 34 at the determined operational speed. The fan motors 36 may then rotate the fan blades at the determined speed to induce airflow over the condenser coils 32.

Figure 4:
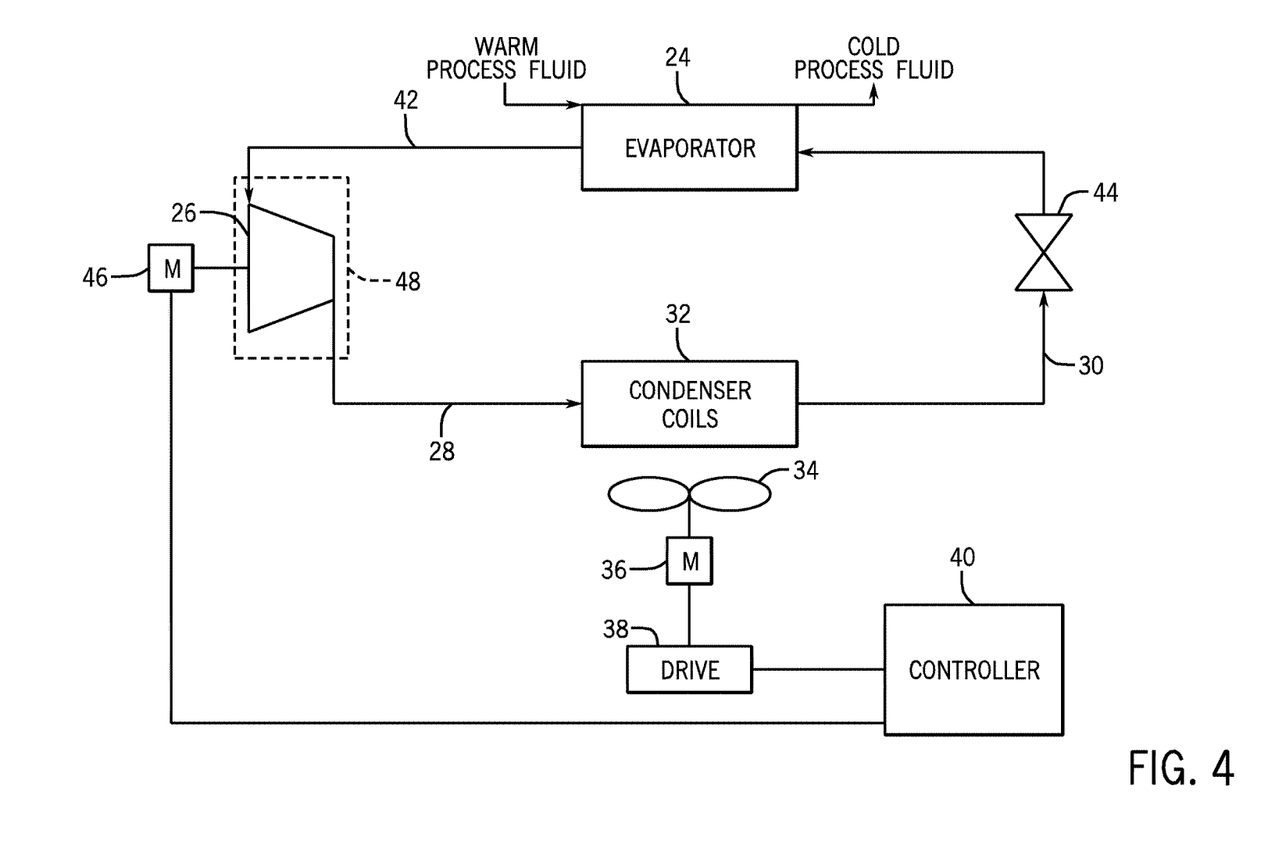
FIG. 4 is a block diagram of an embodiment of the air cooled refrigeration system shown in FIGS. 1 and 2.

FIG. 4 is a schematic diagram of the refrigeration system. As previously discussed with respect to FIGS. 1 and 2, warm process fluid enters the evaporator 24 and is cooled, generating chilled process fluid for the air handlers 18. In cooling the process fluid, refrigerant within the evaporator 24 is vaporized and flows through a suction line 42 into the compressor system 26, which may be representative of one or more compressors. The refrigerant is compressed in the compressor system 26 and exits through the compressor discharge lines 28. The refrigerant then enters the condenser coils 32 where the refrigerant is cooled and condensed to a liquid. From the condenser coils 32, the refrigerant flows through the liquid lines 30 and passes through an expansion valve 44. The expansion valve 44 may be a thermal expansion valve or an electronic expansion valve that varies refrigerant flow in response to suction superheat, evaporator liquid level, or other parameters. Alternatively, the expansion valve 44 may be a fixed orifice or capillary tube. The refrigerant exits the expansion valve 44 and enters the evaporator 24, completing the cycle.

A variety of different compressors, such as centrifugal, scroll, and screw, among others, may be used in the compressor system 26. Regardless of the compressor type, the capacity of the compressor system 26 is typically adjustable. The term "capacity" refers to the total operational displacement rate of refrigerant within the compressor system 26. For example, in compressors, such as screw-type compressors, where the rotational speed may be varied, the compressor system capacity may be adjusted by varying the rotational speed of the compressors. As the rotational speed is increased, more refrigerant may be compressed and displaced, thereby increasing the compressor system capacity. Similarly, as the rotational speed is decreased, less refrigerant may be compressed and displaced, thereby decreasing the compressor system capacity.

The capacity of the compressor system 26 may be adjusted in response to varying loads on the refrigeration system. For example, during periods of high load (e.g., during startup, when relatively warmer process fluid enters the evaporator 24, and/or when ambient temperatures are relatively high) the compressor system capacity may be increased to account for the elevated demand. During periods of low load (e.g., when relatively cooler process fluid enters the evaporator 24 and/or when ambient temperatures are relatively low) the compressor system capacity may be reduced to decrease the electrical power required to run the system. In the illustrated embodiment, the controller 40 may provide input signals representing the desired compressor speed to one or more electric motors 46, which power the compressors within the compressor system 26. Consequently, the compressor system 26 operates to provide the determined compressor system capacity. By varying the compressor system capacity in response to varying loads on the refrigeration system, the refrigeration system may be operated efficiently during all phases of operation.

In the illustrated embodiment, an enclosure 48 is disposed about the compressor system 26 to attenuate acoustical noise emitted of the compressors. A variety of enclosures may be utilized depending on the desired degree of noise attenuation. For example, if increased noise reduction is desired, thick sound insulation may be provided. Alternatively, if a smaller and/or less expensive compressor system is desired, an enclosure having thinner sound insulation may be provided. It should also be appreciated that the number of compressors within the compressor system 26 may be particularly selected to provide a desired design capacity. For example, increasing the number of compressors may increase the maximum capacity and/or the capacity associated with efficient operation of the refrigeration system. In addition, the size of each compressor may be particularly selected to achieve the desired design capacity. For example, larger compressors may be provided to establish increased capacity, while smaller compressors may be utilized within lower capacity refrigeration systems.

The controller 40 also may control operation of the condenser fans 34, as described above with respect to FIG. 3. For example, the controller 40 may adjust the rotational speed of the fans 34 based on the desired rotational speed of the compressors. Further, in embodiments employing staged condenser fans 34, the controller 40 may adjust the number of compressor fans 34 that are operational based on the desired rotational speed of the compressors. Although FIG. 4 depicts a single fan 34 and a single fan motor 36, these components may represent multiple fans within the condenser 14. The motor drive 38 discussed above is electrically coupled to the controller 40. After the controller 40 has determined the fan operational settings that should be used (e.g., based on the capacity of the compressor system 26), the controller 40 may adjust the operation of the fans 34 through the motor drive 38. For example, the controller 40 may provide an input signal to the motor drive 38 to enable operation of one or more of the fans 34. The controller 40 also may provide an input signal to the motor drive 38 to adjust the speed of one or more of the fan motors 36.

As discussed in detail below, the compressor system configuration, the condenser system configuration, and the evaporator system configuration may be particularly selected to provide a desired design capacity and a desired maximum acoustical noise. For example, the number of compressors, the size of each compressor and/or the configuration of the enclosure may be selected to reduce the acoustical noise output of the refrigeration system, while providing the desired capacity. Similarly, the number of condenser coils, the number of cooling fans, the pitch of the fan blades and/or the configuration of the drive units may be selected based on desired design capacity and desired maximum acoustical noise. In this manner, a refrigeration system may be configured that operates within an efficient regime, while limiting acoustical noise to desired levels.

Figure 5A:
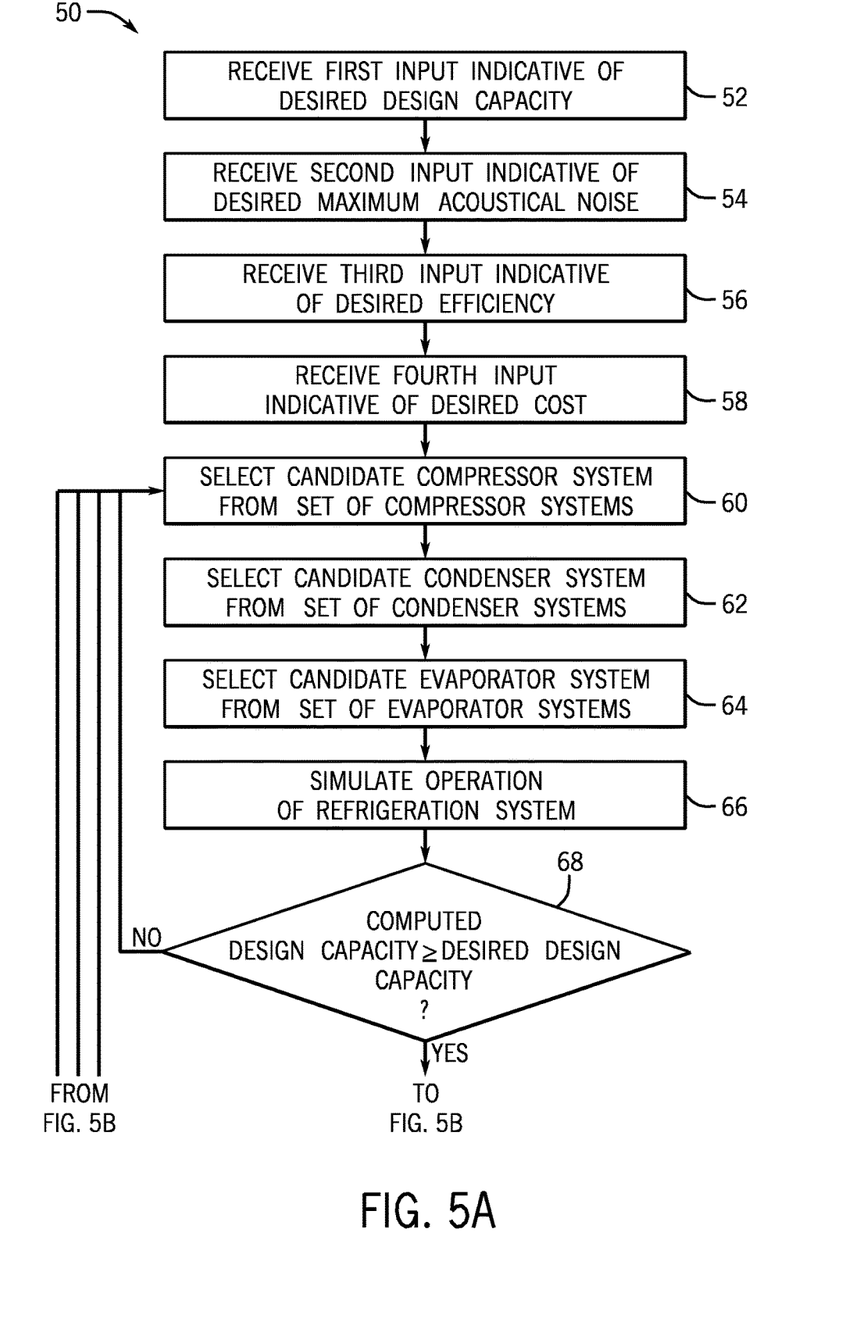
FIG. 5 is a flow diagram of an embodiment of a method for selecting refrigeration system components based on a desired maximum acoustical noise.
Figure 5B:
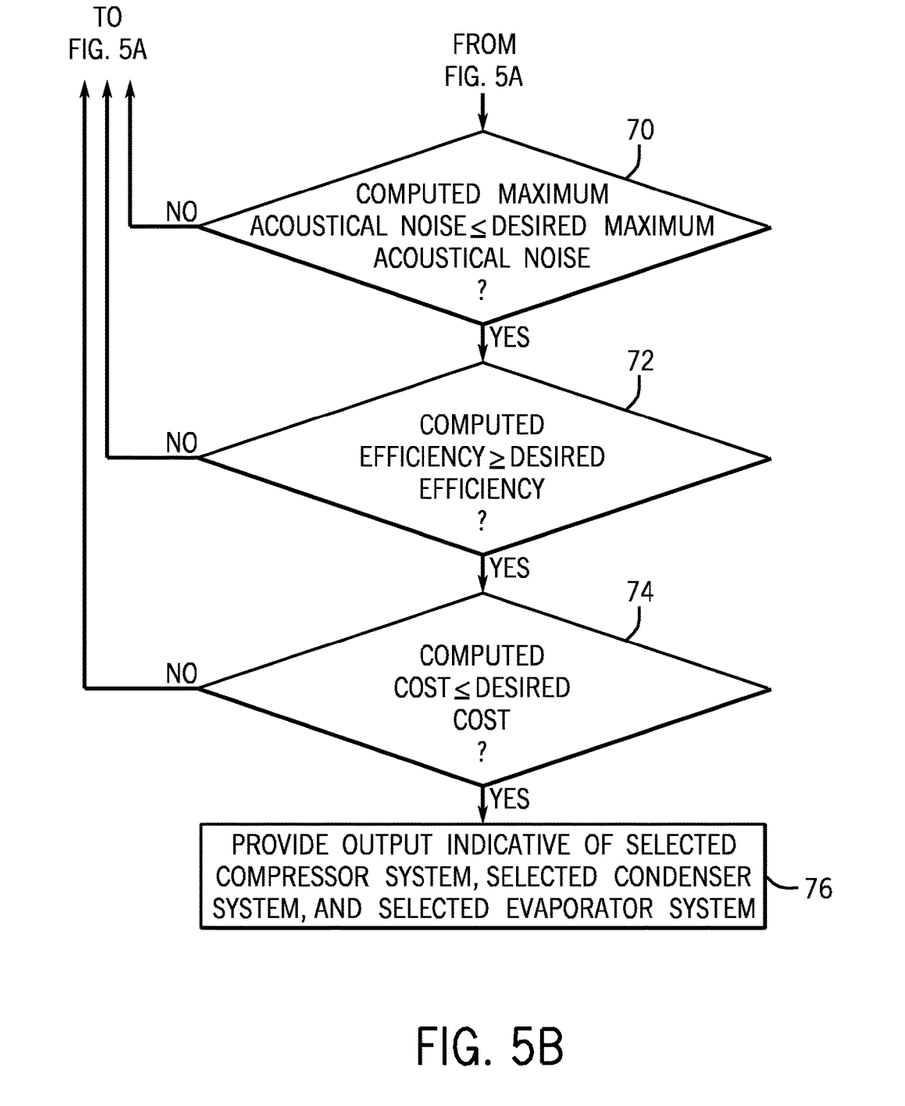

FIG. 5 is a flow diagram of an embodiment of a method 50 for selecting refrigeration system components based on a desired maximum acoustical noise. As discussed in detail below, the method 50 for selecting refrigeration system components may be computer-implement (e.g., via a processor of a data processing system). First, as represented by block 52, a first input indicative of a desired design capacity is received. For example, the desired design capacity may be manually entered through an input device, or transmitted to the data processing system from a remote source. As will be appreciated, the desired design capacity may correspond to the maximum desired capacity or the capacity associated with efficient operation of the refrigeration system (e.g., measured in tons, BTU, watts, etc.). By way of example, the data processing system may receive a first input indicative of a 150 ton desired design capacity. However, as will be appreciated, other desired design capacities may be received in alternative embodiments.

Next, as represented by block 54, a second input indicative of a desired maximum acoustical noise is received. For example, local ordinances may prescribe maximum acoustical noise limits for equipment located on land within a particular commercial or residential zone. As will be appreciated, the acoustical noise of the refrigeration system may vary based on an instantaneous load. Accordingly, the maximum acoustical noise limit may be input into the data processing system to facilitate selection of refrigeration system components that comply with the noise limits throughout the operating range of the refrigeration system. By way of example, the data processing system may receive a second input indicative of an 85 dB maximum acoustical noise. Consequently, refrigeration system components may be selected to limit the maximum acoustical noise output of the refrigeration system to 85 dB. However, as will be appreciated, other maximum acoustical noise limits may be received in alternative embodiments.

In certain embodiments, an ordinance may prescribe a higher maximum acoustical noise limit for daytime operation, and a lower maximum acoustical noise limit for nighttime operation. In such embodiments, the data processing system may be configured to receive a table of maximum acoustical noise as a function of desired design capacity. For example, due to lower ambient temperatures, the desired design capacity may be lower during nighttime operation than during daytime operation. Accordingly, the table may include a lower design capacity associated with a lower maximum acoustical noise limit, and a higher design capacity associated with a higher maximum acoustical noise limit. During the component selection process described below, the data processing system may account for the variable design capacity and the variable acoustical noise to establish a refrigeration system configuration that satisfies the desired input parameters.

In certain embodiments, a third input indicative of a desired efficiency is received, as represented by block 56. As will be appreciated, a refrigeration system having an increased efficiency may provide a desired capacity with less power consumption, thereby reducing operating costs of the refrigeration system. Consequently, the data processing system may receive a third input indicative of a minimum desired efficiency to facilitate selection of refrigeration system components that establish an efficient system for a desired capacity. However, it should be appreciated that alternative embodiments of the data processing system may not receive a desired efficiency. In such embodiments, the refrigeration system components may only be selected based on desired design capacity and maximum acoustical noise.

In further embodiments, a fourth input indicative of a desired cost is received, as represented by block 58. As will be appreciated, refrigeration system components may be selected to provide a large design capacity, a low maximum acoustical noise, and a high efficiency. However, such refrigeration systems may exceed a desired budget. Consequently, the data processing system may be configured to receive an input indicative of a maximum desired cost to facilitate establishing a refrigeration system that conforms to a desired budget. However, it should be appreciated that alternative embodiments of the data processing system may not receive a desired cost. In such embodiments, the refrigeration system components may only be selected based on desired design capacity, maximum acoustical noise and/or efficiency.

Once the inputs have been received, a candidate compressor system is selected from a set of compressor systems, as represented by block 60. For example, candidate compressor systems may include various enclosure configurations, various compressor sizes, and various numbers of compressors. As previously discussed, a sound-absorbing enclosure may be disposed about the compressor(s) to attenuate the acoustical noise emitted by the compressor(s). As will be appreciated, enhancing sound absorbing properties of the enclosure may increase the cost of the system. Consequently, during the refrigeration system evaluation process described below, the data processing system may select an enclosure configuration that conforms to the desired maximum acoustical noise of the refrigeration system, and the cost limitation (if a cost limitation is present).

Furthermore, the set of compressor systems may include compressors of various sizes, and various numbers of compressors. As will be appreciated, increasing the size and/or increasing the number of compressors may increase the total capacity of the refrigeration system, thereby enabling the compressor(s) to operate at a lower speed while providing the desired design capacity. The lower speed operation may increase the efficiency and decrease the acoustical noise of the refrigeration system. However, increasing the size and/or the number of compressors may increase the cost of the system. Consequently, during the refrigeration system evaluation process described below, the data processing system may select a compressor size and/or a number of compressors that conform to the desired maximum acoustical noise of the refrigeration system, and the cost limitation (if a cost limitation is present).

Next, as represented by block 62, a candidate condenser system is selected from a set of condenser systems. For example, candidate condenser systems may include various numbers of condenser coils, various numbers of cooling fans, various fan blade pitches, and various cooling fan drive units. As will be appreciated, increasing the number of condenser coils and/or the number of cooling fans may increase the total capacity of the refrigeration system, thereby enabling the cooling fans to operate at a lower speed to achieve the desired design capacity. The lower speed operation may increase the efficiency and decrease the acoustical noise of the condenser system. In addition, increasing the number of condenser coils and/or the number of cooling fans may decrease the load on the compressor system, thereby enabling the compressor(s) to operate at a lower speed while providing the desired design capacity. The lower speed operation of the compressor(s) may increase the efficiency and decrease the acoustical noise of the compressor system. However, increasing the number of condenser coils and/or cooling fans may increase the cost of the refrigeration system. Consequently, during the refrigeration system evaluation process described below, the data processing system may select a number of condenser coils and/or a number of cooling fans that conform to the desired maximum acoustical noise of the refrigeration system, and the cost limitation (if a cost limitation is present).

In addition, the set of condenser systems may include various cooling fan drive units. For example, certain drive units may include 2 horsepower, 6 pole electric motors configured to rotate at about 1200 rpm, when operated in a synchronous mode. Other drive units may include 2 horsepower, 8 pole electric motors configured to rotate at about 900 rpm, when operated in a synchronous mode. As will be appreciated, the lower speed drive units may emit less noise during operation, but may flow less air through the condenser coils. Lower air flow through the condenser coils may decrease the design capacity of the refrigeration system, and/or may cause the compressor(s) to be operated at a higher speed to provide the desired capacity. Increased compressor speed may decrease efficiency of the refrigeration system and/or may increase the acoustical noise of the compressor system. Consequently, during the refrigeration system evaluation process described below, the data processing system may select a drive unit that conforms to the desired maximum acoustical noise, the desired design capacity, and/or the desired efficiency of the refrigeration system.

Furthermore, the set of condenser systems may include various fan blades having different blade pitches. As will be appreciated, for a particular fan speed, a blade having a higher pitch flows more air through the condenser coils than a blade having a lower pitch. Consequently, for a particular load on the refrigeration system, high pitch blades may be rotated slower than low pitch blades, thereby reducing the acoustical noise of the condenser system. However, high pitch blades may utilize more energy to rotate than low pitch blades. Therefore, during the refrigeration system evaluation process described below, the data processing system may select a fan blade having a pitch that conforms to the desired maximum acoustical noise, the desired design capacity, and/or the desired efficiency of the refrigeration system.

In certain embodiments, a candidate evaporator system is selected from a set of evaporator systems, as represented by block 64. For example, candidate evaporator systems may include various numbers of evaporators, various sizes of the evaporators, and various numbers of refrigerant passes through the evaporators. As will be appreciated, increasing the size and/or increasing the number of evaporators may increase the total capacity of the refrigeration system, thereby enabling the compressor(s) to operate at a lower speed while providing the desired design capacity. The lower speed operation may increase the efficiency and decrease the acoustical noise of the refrigeration system. However, increasing the size and/or the number of evaporators may increase the cost of the refrigeration system. Consequently, during the refrigeration system evaluation process described below, the data processing system may select an evaporator size and/or a number of evaporators that conform to the desired maximum acoustical noise of the refrigeration system, and the cost limitation (if a cost limitation is present). Furthermore, the number of refrigerant passes through the evaporator may be selected based on the particular inputs provided to the data processing system.

Once the candidate compressor system, candidate condenser system, and candidate evaporator system are selected, operation of the refrigeration system is simulated, as represented by block 66. The capacity of the simulated refrigeration system is then computed, and compared to the desired design capacity, as represented by block 68. If the computed design capacity is less than the desired design capacity, another set of candidate systems is selected. Otherwise, the process proceeds to block 70, in which the maximum acoustical noise of the refrigeration system is computed, and compared to the desired maximum acoustical noise. If the computed maximum acoustical noise is greater than the desired maximum acoustical noise, another set of candidate systems is selected. Otherwise, the process proceeds to block 72, in which the efficiency of the refrigeration system is computed, and compared to the desired efficiency. If the computed efficiency is less than the desired efficiency, another set of candidate systems is selected. Otherwise, the process proceeds to block 74, in which the cost of the refrigeration system is computed, and compared to the desired cost. If the computed cost is greater than the desired cost, another set of candidate systems is selected. Otherwise, output indicative of the selected compressor system, the selected condenser system, and the selected evaporator system is provided, as represented by block 76. In this manner, a variety of refrigeration system configurations may be evaluated until a system that satisfies the input parameters is established. If the data processing system is unable to configure a refrigeration system that satisfies the input parameters, an error message may be output. In certain embodiments, the error message may suggest variations to the input parameters sufficient to facilitate configuration of a refrigeration system that satisfies the input parameters.

In certain embodiments, the data processing system is configured to select each candidate compressor system from the set of compressors systems, each candidate condenser system from the set of condenser systems, and each candidate evaporator system from the set of evaporator systems. In such embodiments, a refrigeration system may be selected that satisfies the desired input parameters, and provides a system having a desired optimized parameter. For example, system components may be selected to provide the lowest acoustical noise, the greatest efficiency, or the lowest cost. In this manner, a suitable refrigeration system may be selected based on particular customer inputs.

Figure 6:
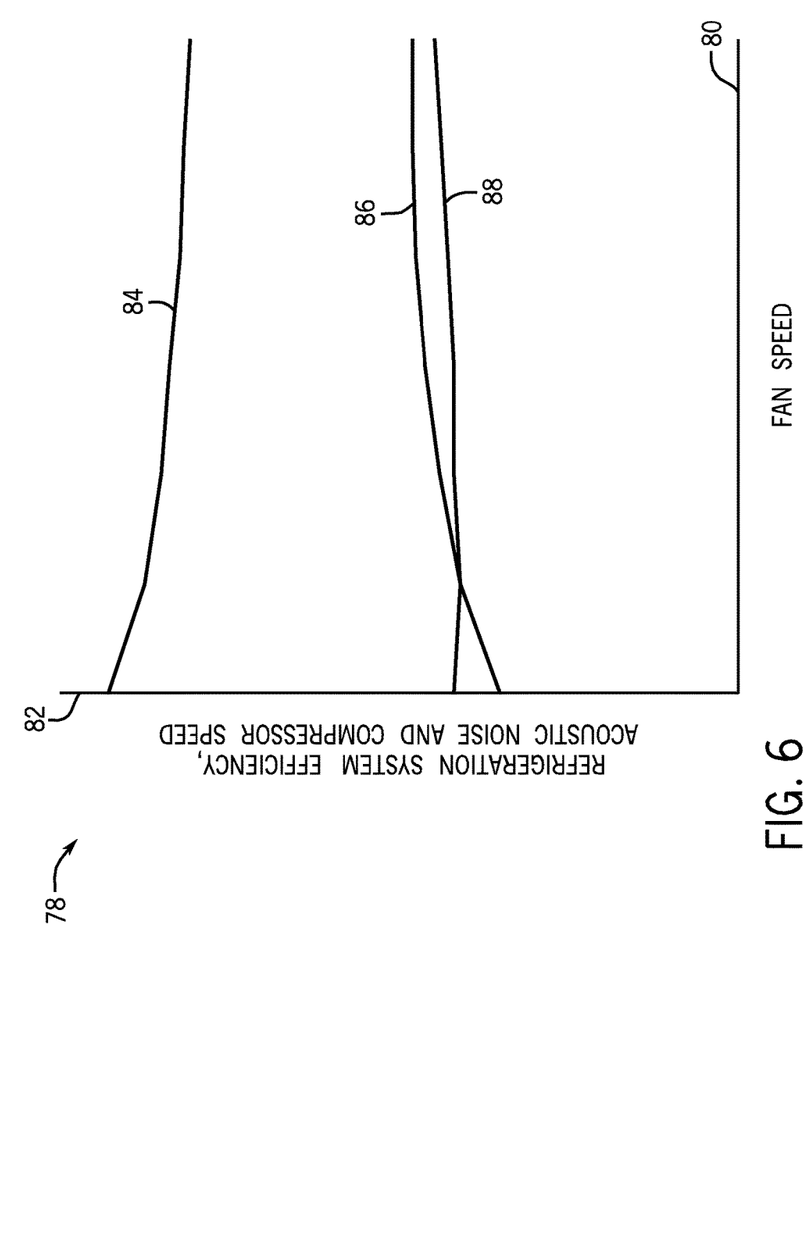
FIG. 6 is an exemplary graph of chiller efficiency, acoustical noise and compressor speed as a function of condenser fan speed.

FIG. 6 is an exemplary graph 78 of chiller efficiency, acoustical noise and compressor speed as a function of condenser fan speed. As illustrated, the graph 78 includes an x-axis 80 representative of condenser fan speed, and a y-axis 82 representative of refrigeration system efficiency, acoustical noise and compressor speed. The graph 78 also includes a first curve 84 representative of compressor speed as a function of condenser fan speed. As illustrated, increasing fan speed reduces the compressor speed sufficient to provide a desired capacity. Furthermore, as indicated by curve 86, which is representative of refrigeration system efficiency as a function of condenser fan speed, efficiency decreases as compressor speed increases. In addition, as indicated by curve 88, which is representative of emitted acoustical noise as a function of condenser fan speed, acoustical noise varies based on condenser fan speed and compressor speed.

As illustrated by curve 88, a minimum acoustical noise may be emitted via operating the condenser fans and the compressor at particular speeds. However, as illustrated by curve 86, the point of minimum acoustical noise is associated with decreased efficiency. Accordingly, if a customer desires quieter operation, the customer (or an automated system) may operate the condenser fans at lower speeds to reduce acoustical noise. Conversely, if a customer desires greater efficiency, the customer (or an automated system) may operate the condenser fans at a higher speed to reduce operational costs. In this manner, a customer may vary operation of a refrigeration system (e.g., configured based on the process described above) to achieve desired operating conditions.

While FIG. 6 shows the relationship between chiller efficiency/acoustical noise and fan speed, it should be appreciated that a similar relationship exists between efficiency/noise and fan blade pitch for a given fan speed. By way of example, for a fixed fan speed, a fan blade pitch may be selected to minimize noise and/or to maximize chiller efficiency. In addition, fan pitch and fan speed may be adjusted to provide an air flow sufficient to achieve a desired chiller capacity for a given compressor speed. Compressor speed may then be adjusted to reduce acoustical noise and/or to enhance chiller efficiency.

Figure 7:
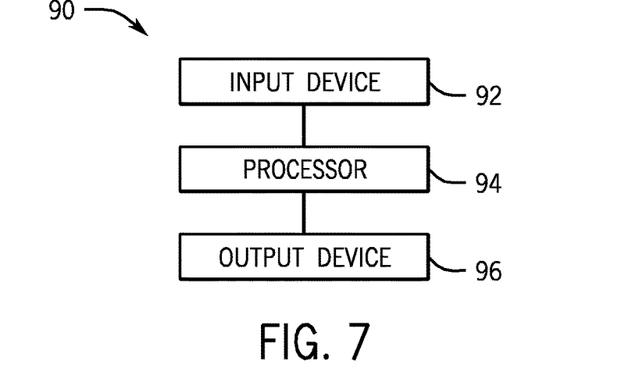
FIG. 7 is a schematic view of an embodiment of a data processing system configured to select refrigeration system components based on a desired maximum acoustical noise.

FIG. 7 is a schematic view of an embodiment of a data processing system 90 configured to select refrigeration system components based on a desired maximum acoustical noise. As illustrated, the data processing system 90 includes an input device 92, a processor 94, and an output device 96. The input device 92 may be configured to receive the inputs indicative of the desired design capacity, the desired maximum acoustical noise, the desired efficiency and/or the desired cost. The processor 94 may be configured to select a refrigeration system configuration based on the process described above with reference to FIG. 5, thereby providing a system that satisfies the input parameters. The output device 96 may be configured to provide the output indicative of the selected refrigeration system components (e.g., in the form of a printout listing the model numbers of the selected components). Consequently, the manufacturer may construct a refrigeration system that conforms to the customer inputs.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A computer-implemented method comprising:
using a processor of a data processing system to perform the steps of:
receiving a first input indicative of a desired design capacity of a refrigeration system;
receiving a second input indicative of a desired maximum acoustical noise of the refrigeration system;
iteratively selecting a candidate compressor system from a plurality of compressor systems, and iteratively selecting a candidate condenser system from a plurality of condenser systems;
simulating operation of the refrigeration system based on the candidate compressor system and the candidate condenser system until a suitable refrigeration system is established having a computed design capacity greater than or equal to the desired design capacity, and a computed maximum acoustical noise less than or equal to the desired maximum acoustical noise; and
providing an output indicative of the candidate compressor system and the candidate condenser system of the suitable refrigeration system.

2. The method of claim 1, wherein the plurality of compressor systems includes candidate compressor systems having various enclosure configurations, various compressor sizes, various numbers of compressors, or a combination thereof.

3. The method of claim 1, wherein the plurality of condenser systems includes candidate condenser systems having various numbers of condenser coils, various numbers of cooling fans, various fan blades, various cooling fan drive units, or a combination thereof.

4. The method of claim 1, comprising iteratively selecting a candidate evaporator system from a plurality of evaporator systems, wherein simulating operation of the refrigeration system is also based on the candidate evaporator system, and the output is also indicative of the candidate evaporator system of the suitable refrigeration system.

5. The method of claim 4, wherein the plurality of evaporator systems includes candidate evaporator systems having various numbers of evaporators, various sizes of the evaporators, various numbers of refrigerant passes through the evaporators, or a combination thereof.

6. The method of claim 1, comprising receiving a third input indicative of a desired efficiency of the refrigeration system, wherein simulating operation of the refrigeration system comprises simulating operation until the suitable refrigeration system is established having a computed efficiency greater than or equal to the desired efficiency.

7. The method of claim 1, comprising receiving a fourth input indicative of a desired cost of the refrigeration system, wherein simulating operation of the refrigeration system comprises simulating operation until the suitable refrigeration system is established having a computed cost less than or equal to the desired cost.

8. The method of claim 1, wherein simulating operation of the refrigeration system comprises simulating operation based on each candidate compressor system and each candidate condenser system, and the suitable refrigeration system is selected based on the refrigeration system having a lowest acoustical noise.

9. The method of claim 1, wherein simulating operation of the refrigeration system comprises simulating operation based on each candidate compressor system and each candidate condenser system, and the suitable refrigeration system is selected based on the refrigeration system having a greatest efficiency.

10. The method of claim 1, wherein simulating operation of the refrigeration system comprises simulating operation based on each candidate compressor system and each candidate condenser system, and the suitable refrigeration system is selected based on the refrigeration system having a lowest cost.

11. A refrigeration system comprising:
a compressor system configured to compress refrigerant;

a condenser system configured to receive and to condense the compressed refrigerant;

an expansion device configured to expand the condensed refrigerant;

an evaporator system configured to evaporate the expanded refrigerant prior to returning the refrigerant to the compressor system; and a data processing system, wherein the compressor system and the condenser system are selected based on a desired design capacity of the refrigeration system, and a desired maximum acoustical noise of the refrigeration system, wherein the compressor system and the condenser system are selected by iteratively selecting a candidate compressor system from a plurality of compressor systems using the data processing system, iteratively selecting a candidate condenser system from a plurality of condenser systems using the data processing system, and simulating operation of the refrigeration system using the data processing system based on the candidate compressor system and the candidate condenser system until a computed design capacity is greater than or equal to the desired design capacity, and a computed maximum acoustical noise is less than or equal to the desired maximum acoustical noise, and wherein the data processing system is configured to provide an output indicative of the candidate compressor system and the candidate condenser system of the suitable refrigeration system.

12. The refrigeration system of claim 11, wherein simulating operation of the refrigeration system comprises simulating operation based on each candidate compressor system and each candidate condenser system, and the compressor system and the condenser system are selected based on the refrigeration system having a lowest acoustical noise.

13. The refrigeration system of claim 11, wherein the evaporator system is selected based on the desired design capacity of the refrigeration system, and the desired maximum acoustical noise of the refrigeration system.

14. The refrigeration system of claim 11, wherein the compressor system and the condenser system are also selected based on a desired cost of the refrigeration system, a desired efficiency of the refrigeration system, or a combination thereof.

15. A system comprising:
a data processing system configured to perform the steps of:

receiving a first input indicative of a desired design capacity of a refrigeration system;

receiving a second input indicative of a desired maximum acoustical noise of the refrigeration system;

iteratively selecting a candidate compressor system from a plurality of compressor systems, and iteratively selecting a candidate condenser system from a plurality of condenser systems;

simulating operation of the refrigeration system based on the candidate compressor system and the candidate condenser system until a suitable refrigeration system is established having a computed design capacity greater than or equal to the desired design capacity, and a computed maximum acoustical noise less than or equal to the desired maximum acoustical noise; and providing an output indicative of the candidate compressor system and the candidate condenser system of the suitable refrigeration system.

16. The system of claim 15, wherein the data processing system is configured to perform the step of iteratively selecting a candidate evaporator system from a plurality of evaporator systems, wherein simulating operation of the refrigeration system is also based on the candidate evaporator system, and the output is also indicative of the candidate evaporator system of the suitable refrigeration system.

17. The system of claim 15, wherein simulating operation of the refrigeration system comprises simulating operation based on each candidate compressor system and each candidate condenser system, and the suitable refrigeration system is selected based on the refrigeration system having a lowest acoustical noise.

18. The system of claim 15, wherein simulating operation of the refrigeration system comprises simulating operation based on each candidate compressor system and each candidate condenser system, and the suitable refrigeration system is selected based on the refrigeration system having a greatest efficiency.

19. The system of claim 15, wherein simulating operation of the refrigeration system comprises simulating operation based on each candidate compressor system and each candidate condenser system, and the suitable refrigeration system is selected based on the refrigeration system having a lowest cost.

* * * * *